United States Patent [19]
Colman

[11] 3,952,249
[45] Apr. 20, 1976

[54] EDGEWISE METER ASSEMBLY
[75] Inventor: Phillip Colman, Needham, Mass.
[73] Assignee: LFE Corporation, Waltham, Mass.
[22] Filed: Sept. 19, 1974
[21] Appl. No.: 507,280

[52] U.S. Cl. ................................. 324/156; 73/431
[51] Int. Cl.² ...................... G01R 1/04; G01P 1/02; G01L 19/14
[58] Field of Search ................. 324/156, 150, 151 R, 324/151 A, 154 R, 155, 157; 73/431; D26/1 Q

[56] References Cited
UNITED STATES PATENTS
3,497,806  2/1970  Nador et al. ........................ 324/156

*Primary Examiner*—R. V. Rolinec
*Assistant Examiner*—Ernest F. Karlsen
*Attorney, Agent, or Firm*—Richard J. Donahue

[57] ABSTRACT

A flat meter assembly with a face displayed along one narrow end in edgewise fashion, the meter movement being mounted entirely in a molded frame and enclosed therein by a U-shaped top and bottom cover applied from the rear and a transparent face cover applied from the front, the two covers snapping together by integral fastenings. A series of lands and grooves along each side of the frame accept spring clips which are loaded by finger pressure and inserted between appropriate grooves and a mounting panel to secure the meter in place.

10 Claims, 3 Drawing Figures

EDGEWISE METER ASSEMBLY

BACKGROUND OF THE INVENTION

1. Field of the Invention

The invention relates to electrical meters and in particular those which are mounted edgewise and have a face displayed along a narrow edge.

2. Description of the Prior Art

The edgewise indicating meter is very economical of panel space making it very popular in the compact equipment of today. However, this very compactness of modern equipment raises difficulties in access for repair and/or replacement. Thus, the meter housing and the way it is adapted for mounting become very significant.

Meter housings can be made like simple boxes in which the bottom of the box is itself the frame or supports the frame while the top of the box is a cover with sidewalls that extend in frictional contact outside or inside the sidewalls of the bottom. U.S. Pat. No. 3,155,906 to C. G. Roper discloses such a housing in which the walls of the box top extend inside the walls of the bottom. U.S. Pat. No. 3,497,806 to J. Nador et al. discloses an open frame design in which the entire meter movement is mounted within a frame formed of peripheral sidewalls. The frame is enclosed by a bottom cover which slides over the frame, a top cover which slides under lips formed in the upstanding sidewalls of the bottom cover, and a transparent end shield that provides a window for the meter face.

The more popular means for mounting meters to mounting panels have avoided the use of screw holes in the panels. Thus, it has been common to have some type of extendng rim or lip securely attached near the face of the meter whereby the body of the meter may be passed through a panel aperture from the front until it comes up against the rim. Then some form of clamping means is provided on the back side of the panel to hold the meter secure. Usually, this clamping means is separable and can be engaged to the meter body somehow after insertion since otherwise it would interfere with insertion of the meter through the panel.

U.S. Pat. No. 3,435,341 to A. A. Baron et al. discloses a mounting means in which lugs connect into recesses on each side of the meter housing and screws threaded through the lugs bear up against the inside of the panel to pull the exterior rim tightly against the panel.

Generally speaking, the prior art edgewise indicating meters have not been particularly easy to mount, disassemble or assemble. Housings have usually included a number of parts screwed or bolted together. Panel mounting has required juggling a number of pieces simultaneously while trying to tighten clamping screws.

SUMMARY OF THE INVENTION

Now in accordance with the present invention, an edgewise indicating meter is provided in which the meter movement is entirely mounted in an open frame which is then encased by a one-piece top-and-bottom cover which snaps together with a transparent face cover to provide a three-piece housing that is extremely easy to assemble and service. The frame is additionally provided with a series of lands and grooves along a portion of each side to accept spring clips which are loaded by finger pressure and inserted between appropriate grooves and a mounting panel to secure the meter in place.

Thus, it is an object of the invention to provide an edgewise indicating meter with novel housing construction.

It is a further object of the invention to provide an edgewise indicating meter with a novel combination of housing construction and mounting means.

Further objects and features of the invention will become apparent upon reading the following disclosure together with the Drawing.

DESCRIPTION OF THE PREFERRED EMBODIMENT

Figure 1:
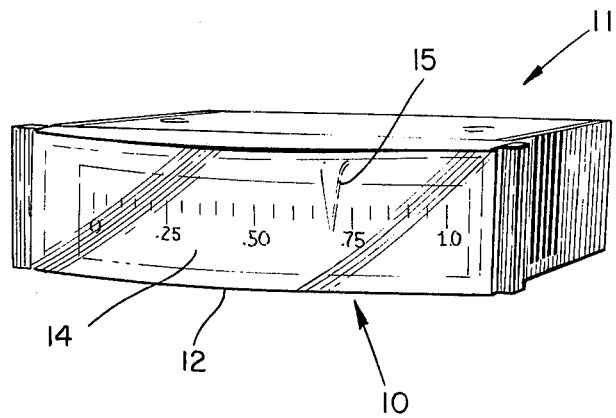
FIG. 1 is a perspective view of a meter according to the invention.

A meter in accordance with the invention is depicted in FIG. 1 having face 10 and body 11. Face 10 is enclosed in a transparent face cover 12 through which meter scale 14 is shown. Indicator needle 15 is movable across scale 14 by a meter movement enclosed within body 11.

Figure 2:
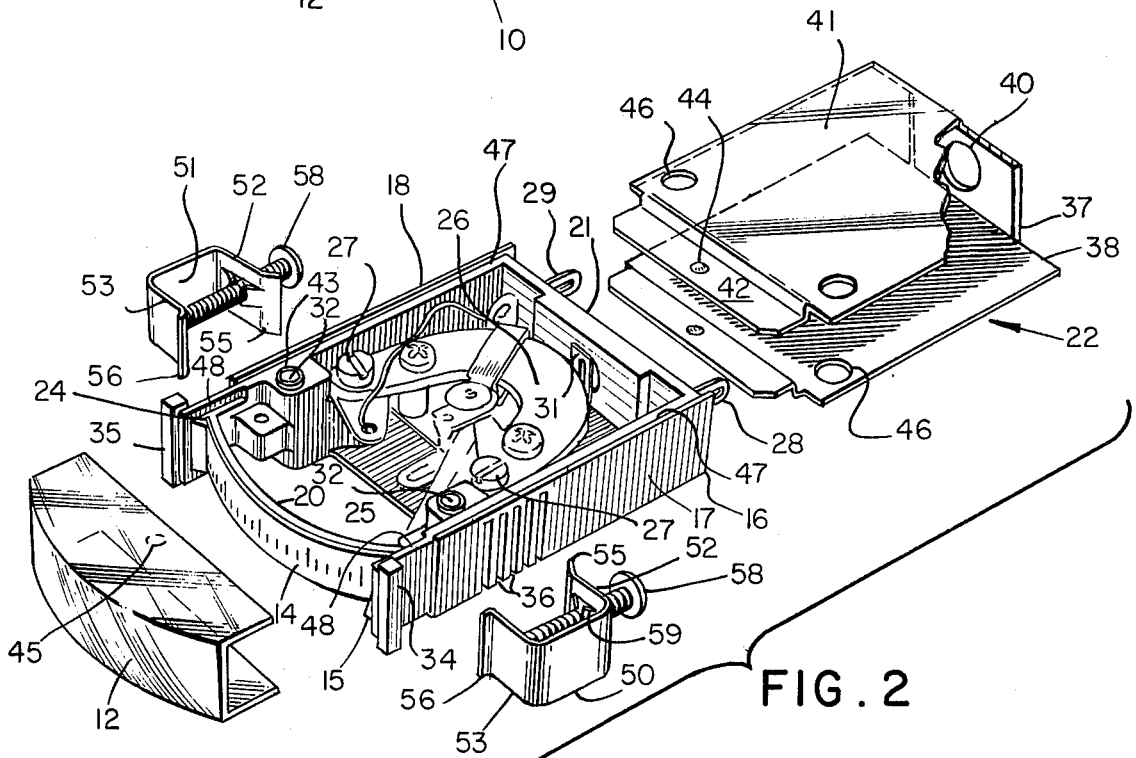
FIG. 2 is an exploded view of a meter in accordance with the invention.

Referring to FIG. 2, it can be seen that body 11 consists of a frame 16 having first sidewall 17, second sidewall 18, first endwall 20 and second endwall 21. Body 11 also includes a one-piece and top-and-bottom cover assembly 22. Meter scale 14 is a separable flat springy material, the ends of which fit into recesses 24 and 25 at each end of endwall 20. Endwall 20 has a curved contour and meter scale 14 is sprung into recesses 24 and 25 so as to conform to the contour of endwall 20. Meter movement 26 carrying indicator needle 15 is mounted in frame 16 by mounting screws 27. Electrical connections for movement 26 pass through second endwall 21 to terminals 28 and 29. Zero adjustment mechanism 31 is operated by an eccentric with a screw slot (not shown) on the exterior side of endwall 21. Two holes 32 inside member 17 and 18 are provided for mounting bolts in case it is desired to stack a number of meters together. Frame 16 is preferably cast or molded and is desirably molded from a strong plastic resin such as a polycarbonate. Laterally projecting rims 34 and 35 are molded into the ends of sidewalls 17 and 18 respectively, in the vicinity of first endwall 20, for the purpose of retaining the meter in a panel aperture. Polycarbonate resins are strong enough so that relatively thin rims of this type may be used without risk of breakage. Sidewalls 17 and 18 also each have a plurality of lands and grooves 36 molded across their exterior surface a short distance in back of rims 34 and 35.

Cover 22 has an upstanding rear portion 37 for positioning against second endwall 21. Upstanding portion 37 is formed by folds for providing the top-and-bottom cover portions. Upstanding portion 37 is cut out at both sides to provide openings 38 for electrical terminals 28 and 29. A circular opening 40 is also cut in the center of upstanding portion 37 for access to the adjusting screw slot (not shown) for adjusting mechanism 31.

In the depicted embodiment, cover 22 is completely symmetrical so that it may be installed with either side up. Thus, it will be sufficient to describe the bottom cover portion only which is depicted uppermost in FIG. 2. Bottom cover portion 41 is depicted as partially cut away to show openings 38 and 40 at the rear. The front edge of cover portion 41 is pressed downward to form depressed edge 42 for fitting under face cover 12. The center of depressed edge 42 has a raised dimple 44 mating with a recession 45 formed on the inside of face cover 12. Behind depressed area 42, circular apertures 46 are provided for fitting over raised rims 43 of holes 32. Along the top and bottom edges of first and second sidewalls 17 and 18 are longitudinal recesses 47 located both top and bottom for receiving cover 22 flush with sidewalls 17 and 18. Similarly recesses are provided in the forward portions of sidewalls 17 and 18 in the form of guideways 48 for face cover 12.

Two U-shaped spring clips 50 and 51 are provided each having a first leg 52 and a second leg 53. First leg 52 terminates in an out turned foot 55 shaped to fit into one of the grooves of lands and grooves 36. Leg 53 also has an outwardly turned foot 56 for fitting inside the edge of a mounting panel, as can be better seen in FIG. 3. Screws 58 are threaded into screw apertures 59 to provide a spreading force between legs 52 and 53.

Figure 3:
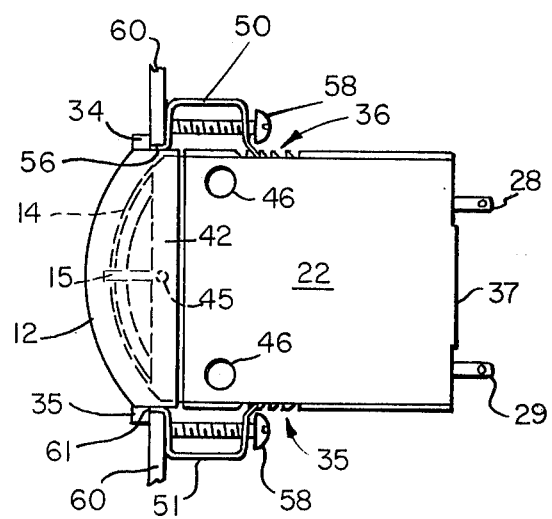
FIG. 3 is a plan view of a meter according to the invention mounted to a panel partially shown in section.

In referring to FIG. 3, it should be noted that FIG. 3 is a top plan view while FIG. 2 is depicted from the bottom so that many of the reference numerals appear reversed in FIG. 3 with respect to FIG. 2.

As depicted in FIG. 3, lands and grooves 36 are angled and foot 55 is similarly angled to snuggly engage the grooves. Panel 60, for mounting meter body 11, is partially shown in section to illustrate fastening means for clamping the meter to a panel. Meter body 11 is passed through panel aperture 61 until rim portions 34 and 35 come up against the panel. Then U-shaped spring clips 50 and 51 are inserted so that feet 56 are located between the respective sidewalls and panel 60. Feet 56 so located hold clips 50 and 51 in place when screws 58 are tightened. Then the rear legs 52 are pressed forward until feet 55 can be retained in one of lands and grooves 36 under tension. This is sufficient to hold the meter in place. However, for more tightly securing the meter, screws 58 can be tightened to force legs 52 and 53 apart.

The cover assembly consisting of cover 22 and face cover 12 is easily assembled and disassembled. In assembly, cover 22 is inserted over second endwall 21 and the top and bottom portions are pressed down over the protuding portions 43 of holes 32 (see FIG. 2). Face cover 12 is then pushed on to frame 16 over guideway 48 until it passes over depressed portions 42 of cover 22. Recess 45 located in both top and bottom surfaces snaps together holding dimples 44 in the top and bottom of cover 22.

In FIG. 3, the transparency of face cover 12 shows depressed area 42 and meter scale 14 through cover 12.

While the invention has been described with respect to a specific embodiment, variations obvious to those skilled in the art are contemplated and it is intended to cover the invention within the full scope of the appended claims.

I claim:

1. An edgewise indicating meter comprising:
   a. a main support frame having first and second endwalls and first and second sidewalls;
   b. a meter movement mounted in said frame having an indicator needle exposed beyond said first endwall;
   c. electrical terminals passing through and supported by said second endwall;
   d. a top and bottom cover formed in a single piece folded at the middle and extending over the top and bottom of said frame from said second endwall; and,
   e. a one-piece window for said needle fitting over said first endwall and lockingly engage with said cover securing both said cover and said window in place on said frame.

2. An edgewise indicating meter according to claim 1 wherein said cover and said window lockingly engage by means of integral mating raised and recessed areas.

3. An edgewise indicating meter according to claim 1 wherein said cover has openings where it passes over said second endwall for said terminals.

4. An edgewise indicating meter according to claim 1 wherein said first endwall has a curved contour terminating in recesses at the first and second sidewalls and a flat support member bearing a meter scale is springingly snapped into said recesses conforming to said contour.

5. An edgewise indicating meter according to claim 1 wherein said first and second sidewalls protrude laterally adjacent to said first endwall for engaging at an aperture of a panel in which said meter is to be mounted and mounting attachments are coupled between said protrusions and said first and second sidewalls for clamping a mounting panel between said protrusions and said mounting attachments.

6. An edgewise indicating meter according to claim 1 wherein said frame is a molded plastic frame, said cover is stamped in a single piece from sheet metal and said window is molded in a single piece from transparent plastic.

7. An edgewise indicating meter according to claim 1 and further comprising:
   f. a rim substantially at said first endwall and extending beyond said first and second sidewalls so as to engage the exterior edges around a mounting aperture in a panel;
   g. first and second spring clips each having a first and second legs; and,
   h. a plurality of lands and grooves on each of said first and second sidewalls for receiving the first legs of said first and second spring clips respectively whereby the second legs of said first and second spring clips can be sprung against the inside of a mounting panel for engaging said panel between said clips and said rim.

8. An edgewise indicating meter according to claim 7 wherein the legs of said spring clips each have outwardly turned feet.

9. An edgewise indicating meter according to claim 8 wherein the first legs of said first and second spring clips have threaded apertures carrying screws whereby said screws can be turned to bear against said second legs forcing them apart from said first legs to secure an engaged panel with greater force.

10. An edgewise indicating meter according to claim 7 wherein said rim is a lateral projection from the end of each of said first and second sidewalls and said plurality of lands and grooves are spaced from said rim on each side sidewalls so as to adjustably locate said first legs; thus, adapting to different panel thicknesses.

* * * * *